(12) United States Patent
Delano et al.

(10) Patent No.: US 10,797,660 B2
(45) Date of Patent: Oct. 6, 2020

(54) MULTIPHASE BUCK-BOOST AMPLIFIER

(71) Applicant: Maxim Integrated Products, Inc., San Jose, CA (US)

(72) Inventors: Cary Delano, Los Altos, CA (US); Doug Heineman, San Jose, CA (US); Graeme Docherty, Austin, TX (US); Feng Yu, Sunnyvale, CA (US)

(73) Assignee: MAXIM INTEGRATED PRODUCTS, INC., San Jose, CA (US)

( * ) Notice: Subject to any disclaimer, the term of this patent is extended or adjusted under 35 U.S.C. 154(b) by 0 days.

(21) Appl. No.: 16/384,165

(22) Filed: Apr. 15, 2019

(65) Prior Publication Data

US 2019/0319593 A1  Oct. 17, 2019

Related U.S. Application Data

(60) Provisional application No. 62/658,186, filed on Apr. 16, 2018.

(51) Int. Cl.
| | |
|---|---|
| *H02M 3/158* | (2006.01) |
| *H03F 3/217* | (2006.01) |
| *H04R 3/00* | (2006.01) |

(52) U.S. Cl.
CPC ........ *H03F 3/2178* (2013.01); *H02M 3/1582* (2013.01); *H04R 3/00* (2013.01); *H03F 2200/03* (2013.01); *H03F 2200/301* (2013.01); *H03F 2200/312* (2013.01); *H03F 2200/417* (2013.01); *H03F 2203/21175* (2013.01)

(58) Field of Classification Search
None
See application file for complete search history.

(56) References Cited

U.S. PATENT DOCUMENTS

| | | | |
|---|---|---|---|
| 8,355,268 B2 | 1/2013 | Boeke | |
| 9,178,422 B2 | 11/2015 | Dash et al. | |
| 10,171,022 B2 | 1/2019 | Kim et al. | |
| 2013/0229841 A1* | 9/2013 | Giuliano | H02M 1/4225 363/60 |

* cited by examiner

*Primary Examiner* — Ping Lee

(57) ABSTRACT

Various buck-boost amplifier architectures are disclosed. In some architectures, a plurality of amplifiers use one or more inductors from a shared bank of inductors as needed to deliver variable amounts of power to respective loads. In some architectures, each amplifier includes multiple inductors and switches that are controlled to vary the number of inductors used in an amplifier based on a power requirement of the amplifier to drive its load. In some architectures, the switches include well switching devices. In some architectures, each amplifier drives multiple loads and is operated in a single inductor multiple output (SIMO) mode. In all architectures, the loads include speakers, piezo elements, and motors.

8 Claims, 12 Drawing Sheets

MULTIPHASE BUCK-BOOST AMPLIFIER

CROSS-REFERENCE TO RELATED APPLICATIONS

This application claims the benefit of U.S. Provisional Application No. 62/658,186, filed on Apr. 16, 2018. The entire disclosure of the application referenced above is incorporated herein by reference.

FIELD

The present disclosure relates generally to amplifiers and more particularly to multiphase buck-boost amplifiers.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Power amplifiers are used in many devices and applications to drive loads. For example, in wireless devices, power amplifiers are used to drive antennas as loads. For example, in audio applications (e.g., in handheld computing devices such as smartphones including speakers), power amplifiers are used to drive speakers as loads.

SUMMARY

A system comprises a first buck-boost amplifier that is connected to a battery, that includes a first inductor, and that drives a first load. The system further comprises a second buck-boost amplifier that is connected to the battery, that includes a second inductor, and that drives a second load. The system further comprises a third inductor, a plurality of switches connected to the third inductor, and a controller that drives the plurality of switches to connect the third inductor to the first buck-boost amplifier or the second buck-boost amplifier.

In other features, the controller drives the plurality of switches to connect the third inductor to the first buck-boost amplifier or the second buck-boost amplifier based on an amount of power used by the first and second buck-boost amplifiers to respectively drive the first and second loads.

In other features, the first and second buck-boost amplifiers additionally drive the second and first loads, respectively.

In other features, the first and second loads include speakers, piezo elements, or motors.

In other features, the plurality of switches includes well switching devices.

In other features, the system further comprises a fourth inductor and a second plurality of switches connected to the fourth inductor. The controller drives the second plurality of switches to connect the fourth inductor to the first buck-boost amplifier or the second buck-boost amplifier.

In other features, the controller drives the second plurality of switches to connect the fourth inductor to the first buck-boost amplifier or the second buck-boost amplifier based on an amount of power used by the first and second buck-boost amplifiers to respectively drive the first and second loads.

In other features, the plurality of switches and the second plurality of switches include well switching devices.

In still other features, a system comprises a first buck-boost amplifier that is connected to a battery, that includes a first inductor, and that drives a first load. The system further comprises a second buck-boost amplifier that is connected to the battery, that includes a second inductor, and that drives a second load. The system further comprises a plurality of inductors, a plurality of switches connected to the plurality of inductors, and a controller that drives the plurality of switches to connect one or more of the plurality of inductors to one or more of the first and second buck-boost amplifiers.

In other features, the controller drives the plurality of switches to connect one or more of the plurality of inductors to one or more of the first and second buck-boost amplifiers based on an amount of power used by the first and second buck-boost amplifiers to respectively drive the first and second loads.

In other features, the plurality of switches includes well switching devices.

In other features, the first and second loads include speakers, piezo elements, or motors.

In still other features, a system comprises a plurality of buck-boost amplifiers that are connected to a battery and that drive respective loads. Each of the plurality of buck-boost amplifiers includes an inductor. The system further comprises a plurality of inductors, a plurality of switches connected to the plurality of inductors, and a controller that drives the plurality of switches to connect one or more of the plurality of inductors to one or more of the plurality of buck-boost amplifiers.

In other features, the controller drives the plurality of switches to connect one or more of the plurality of inductors to one or more of the plurality of buck-boost amplifiers based on an amount of power used by the one or more of the plurality of buck-boost amplifiers to drive the respective loads.

In other features, the plurality of switches includes well switching devices.

In other features, the loads include speakers, piezo elements, or motors.

In still other features, a system comprises a buck-boost amplifier that is connected to a battery, that includes an inductor and a plurality of switches connected to the inductor, and that drives a plurality of loads. The system further comprises a controller that drives the plurality of switches to operate the buck-boost amplifier in a single inductor multiple output mode.

In other features, the plurality of switches includes well switching devices.

In other features, the plurality of loads includes speakers, piezo elements, or motors.

In still other features, a system comprises a first buck-boost amplifier that is connected to a battery, that includes a first inductor and a first plurality of switches connected to the first inductor, and that drives a first load and a second load. The system further comprises a second buck-boost amplifier that is connected to the battery, that includes a second inductor and a second plurality of switches connected to the second inductor, and that drives the first load and the second load. The system further comprises a controller that drives the first and second plurality of switches to operate each of the first and second buck-boost amplifiers in a single inductor multiple output mode.

In other features, the first and second plurality of switches include well switching devices.

In other features, the first and second loads include speakers, piezo elements, or motors.

In still other features, a system comprises a plurality of buck-boost amplifiers that are connected to a battery and that drive respective loads. Each of the plurality of buck-boost amplifiers includes a plurality of inductors and a plurality of switches connected to the plurality of inductors. The system further comprises a controller that drives the plurality of switches to utilize one or more of the plurality of inductors based on an amount of power used by each of the plurality of buck-boost amplifiers to drive the respective loads.

In other features, one buck-boost amplifier of the plurality of buck-boost amplifiers drives an associated load with more power than an average or peak power of the plurality of buck-boost amplifiers.

In other features, a first buck-boost amplifier of the plurality of buck-boost amplifiers that drives an associated load with more power than a second buck-boost amplifier of the plurality of buck-boost amplifiers uses more inductors from the plurality of inductors than the second buck-boost amplifier.

In other features, the plurality of switches includes well switching devices.

In other features, the loads include speakers, piezo elements, or motors.

In still other features, a system comprises a plurality of buck-boost amplifiers that are connected to a battery and that drive respective loads. Each of the plurality of buck-boost amplifiers includes a plurality of inductors and a plurality of switches connected to the plurality of inductors. The system further comprises a controller that drives the plurality of switches to utilize one or more of the plurality of inductors based on an amount of power used by each of the plurality of buck-boost amplifiers to drive a single load.

In other features, one buck-boost amplifier of the plurality of buck-boost amplifiers drives the load with more power than an average or peak power of the plurality of buck-boost amplifiers.

In other features, a first buck-boost amplifier of the plurality of buck-boost amplifiers that drives the load with more power than a second buck-boost amplifier of the plurality of buck-boost amplifiers uses more inductors from the plurality of inductors than the second buck-boost amplifier.

In other features, the plurality of switches includes well switching devices.

In other features, the load includes a speaker, a piezo element, or a motor.

In still other features, a system comprises a first buck-boost amplifier that is connected to a battery, that includes a first inductor, and that drives a first load. The system further comprises a second buck-boost amplifier that is connected to the battery, that includes a second inductor, and that drives a second load. The system further comprises third and fourth inductors, a plurality of switches connected to the third and fourth inductors, and a controller that drives the plurality of switches to connect one or more of the third and fourth inductors to the first buck-boost amplifier or the second buck-boost amplifier based on an amount of power used by the first and second buck-boost amplifiers to respectively drive the first and second loads. The first and second buck-boost amplifiers additionally drive the second and first loads, respectively. The first and second loads include speakers, piezo elements, or motors. The plurality of switches includes well switching devices.

In still other features, a system comprises a first buck-boost amplifier that is connected to a battery, that includes a first inductor and a first plurality of switches connected to the first inductor, and that drives a first load and a second load. The system further comprises a second buck-boost amplifier that is connected to the battery, that includes a second inductor and a second plurality of switches connected to the second inductor, and that drives the first load and the second load. The system further comprises a controller that drives the first and second plurality of switches to operate each of the first and second buck-boost amplifiers in a single inductor multiple output mode. The first and second plurality of switches include well switching devices. The first and second loads include speakers, piezo elements, or motors.

In still other features, a system comprises a plurality of buck-boost amplifiers that are connected to a battery and that drive respective loads. Each of the plurality of buck-boost amplifiers includes a plurality of inductors and a plurality of switches connected to the plurality of inductors. The system further comprises a controller that drives the plurality of switches to utilize one or more of the plurality of inductors based on an amount of power used by each of the plurality of buck-boost amplifiers to drive the respective loads. A first buck-boost amplifier of the plurality of buck-boost amplifiers that drives an associated load with more power than a second buck-boost amplifier of the plurality of buck-boost amplifiers uses more inductors from the plurality of inductors than the second buck-boost amplifier. The plurality of switches includes well switching devices. The loads include speakers, piezo elements, or motors.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

The present disclosure relates to various buck-boost amplifier architectures that use shared inductors as needed to deliver variable amounts of power to respective loads as explained below. The additional inductors also help minimize triangle waveforms in inductor currents as explained below.

Figure 1:
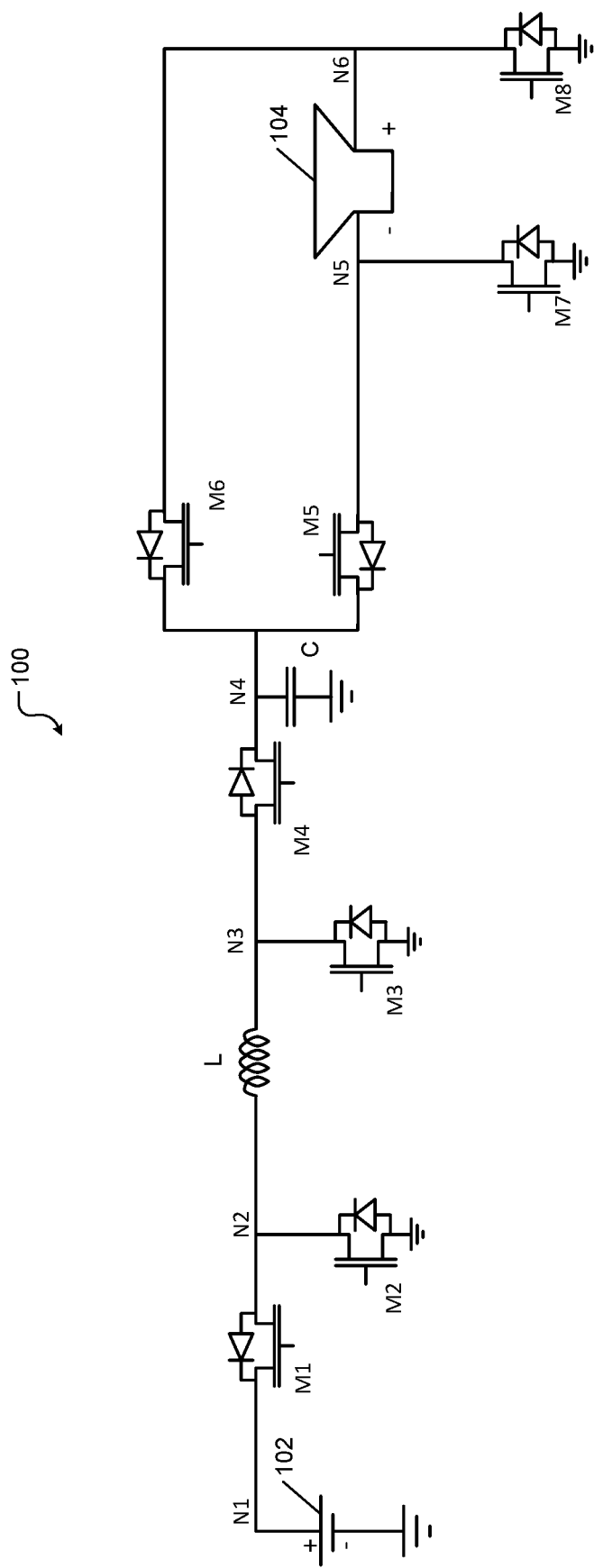
FIG. 1 shows an example circuit diagram of a buck-boost amplifier.
Figure 2:
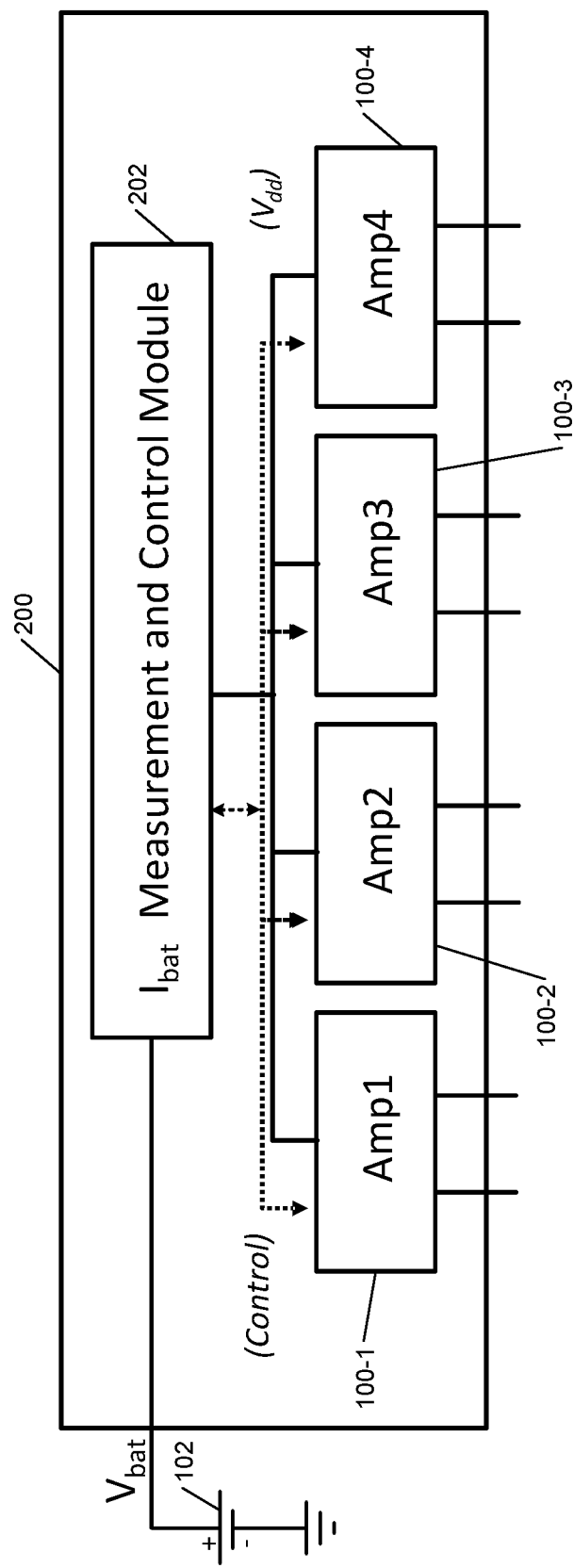
FIG. 2 shows an example of an amplifier architecture comprising a plurality of buck-boost amplifiers that allow averaging of amplifier supply currents while also limiting battery current.
Figure 3A:
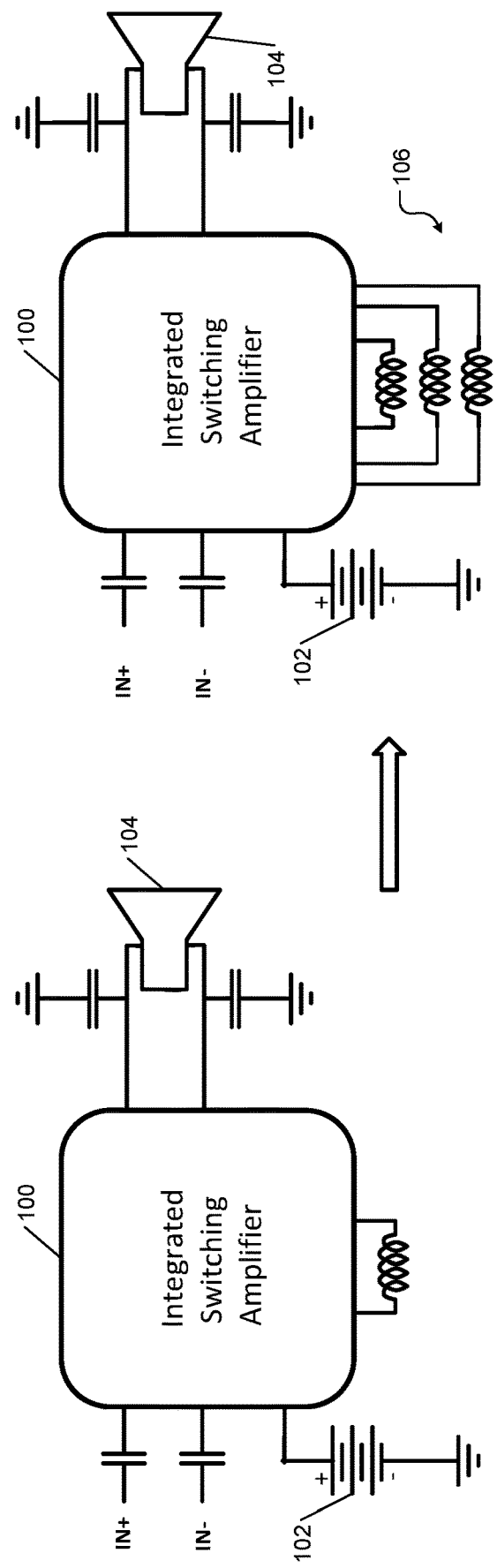
FIG. 3A shows an example of a multiphase buck-boost amplifier.
Figure 3B:
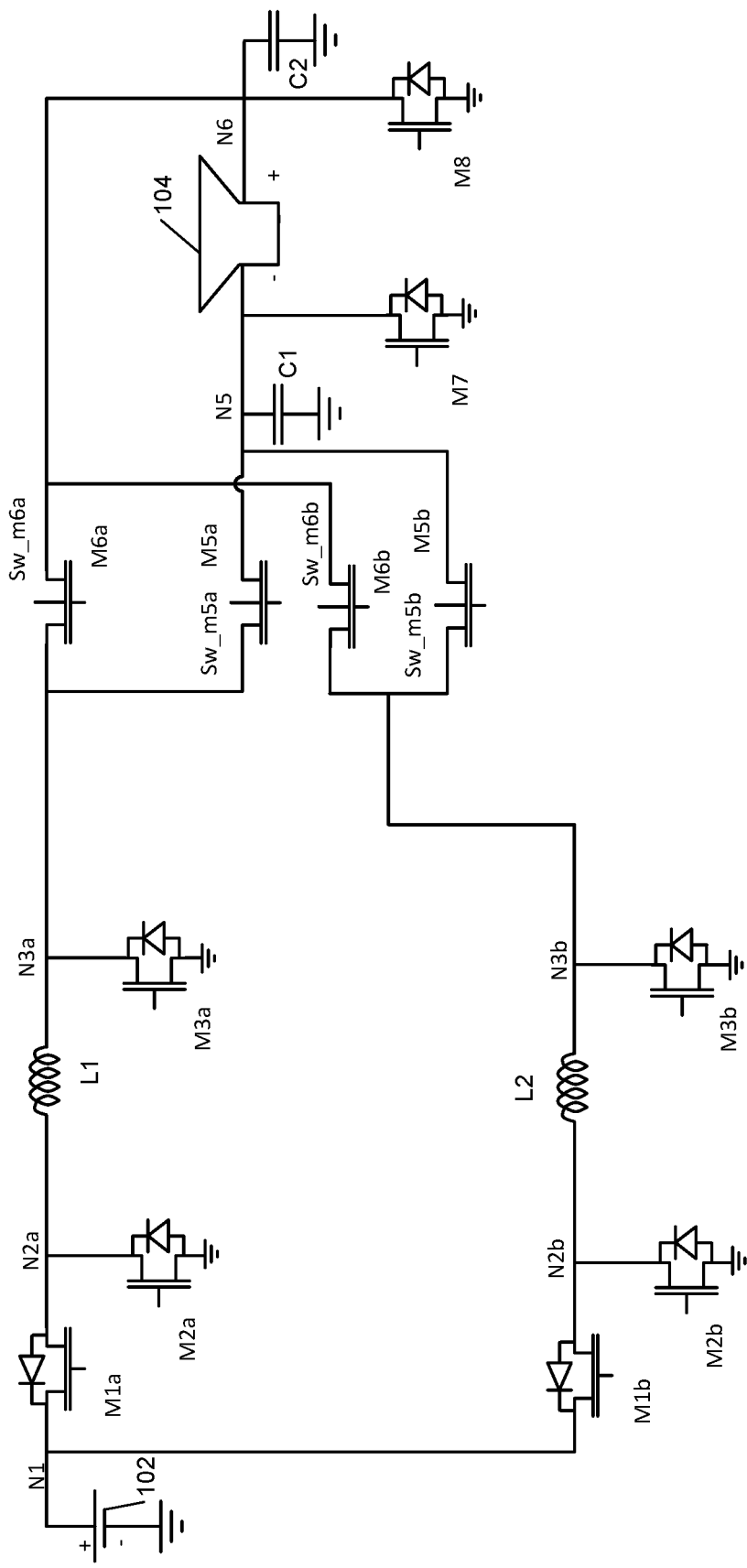
FIG. 3B shows an example circuit diagram of multiple buck-boost amplifiers driving a single load.
Figure 4:
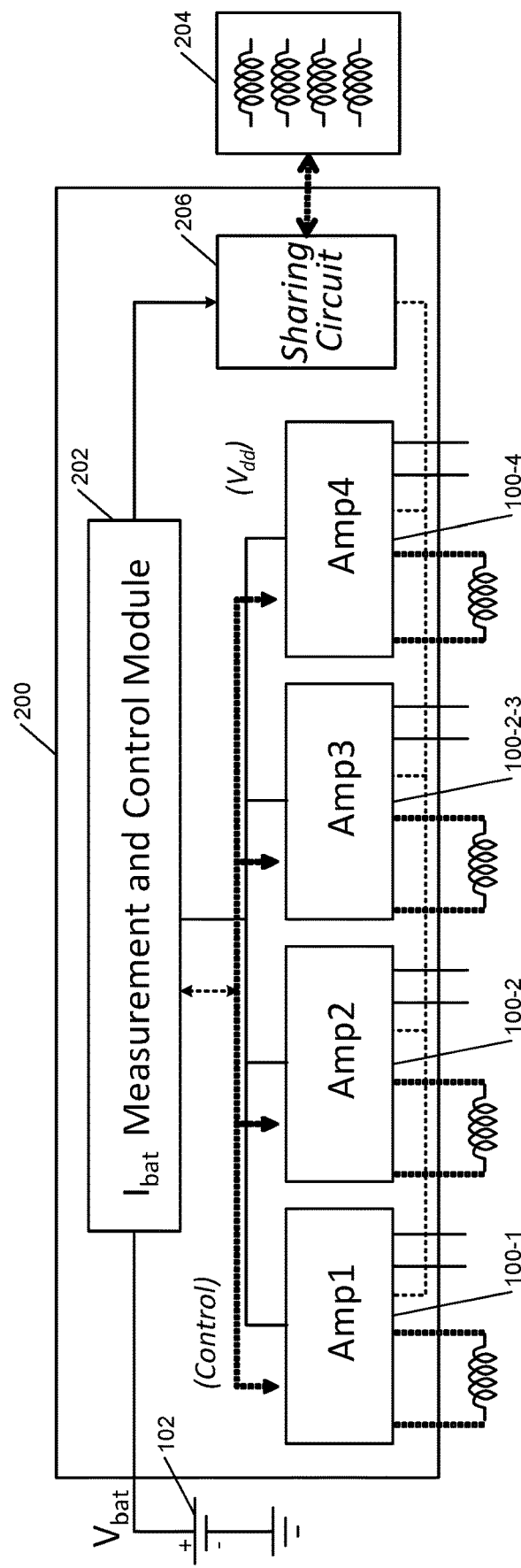
FIG. 4 shows an example of an amplifier architecture comprising a plurality of buck-boost amplifiers that share extra multiphase inductors.

The present disclosure is organized as follows. FIG. 1 introduces a buck-boost amplifier and outlines issues resolved by the amplifier architectures of the present disclosure. FIG. 2 presents an overview of the amplifier architecture according to the present disclosure. FIG. 3A shows an amplifier architecture including variants of both single and multiple amplifiers, where an inductor of each amplifier is split into multiple inductors. FIG. 3B an example circuit diagram of multiple buck-boost amplifiers driving a single load. FIG. 4 shows an amplifier architecture including multiple amplifiers that share additional inductors from an inductor bank to deliver variable amounts of power to respective loads. FIGS. 5-10 show detailed examples of sharing the inductors from the inductor bank between the amplifiers, including using well switching (i.e., body diode switching) devices to reduce the number of transistors used in the amplifiers. FIG. 11 shows an additional example of a buck-boost amplifier that uses well switching devices.

Throughout the present disclosure, all amplifiers include buck mode, and boost and/or buck-boost modes. Transistors are referred to as switches. Each switch has two terminals and a control terminal that is used to operate the switch. Diodes shown for all transistors are part of the transistor and are shown for illustration purposes. Speakers are shown as loads for example only. Other examples of the loads include but are not limited to RF power amplifiers, power supplies for load circuitry, piezo elements, motors, resistors, etc. Well switching (i.e., body diode switching) devices are introduced later in the present disclosure (e.g., see switches M4xx in FIG. 8 and switches M5xx and M6xx in FIG. 10). However, it should be understood that these devices are shown as an example of one possible configuration and can be used in all the examples shown and described in the present disclosure regardless of their express mention or inadvertent omission in any of the examples. The terms well switching devices and body diode switching devices are used interchangeably and synonymously. Well switching is the disconnection and connection of the well of a MOS transistor to either the drain or source nodes (or another node of desired voltage) in order to control when the parasitic diodes are on or off. The disconnection and connection can be done with additional smaller transistors. Double-diffused MOS (DMOS) transistors are built in such a way that well switching is not possible but they are much more area dense as a result.

FIG. 1 shows an example of a buck-boost amplifier (hereinafter amplifier) 100. In the amplifier 100, switches M1 and M2 are connected across a battery 102 as shown. Specifically, a first terminal of the switch M1 is connected to a first terminal of the battery 102 at node N1, and a second terminal of the switch M1 is connected to a node N2. A first terminal of the switch M2 is connected to the node N2, and a second terminal of the switch M2 is connected to a reference potential (e.g., ground) to which a second terminal of the battery 102 is connected.

A first terminal of an inductor L is connected to the node N2, and a second terminal of the inductor L is connected to a node N3. A first terminal of a switch M3 is connected to the node N3, and a second terminal of the switch M3 is connected to the reference potential. A first terminal of a switch M4 is connected to the node N3, and a second terminal of the switch M4 is connected to a node N4. A capacitor C is connected across the node N4 and the reference potential.

A load 104 in the form of a speaker driven by the amplifier 100 is connected across nodes N5 and N6 as shown. Switches M5 and M6 respectively connect the nodes N5 and N6 to the node N4 as shown. Specifically, first terminals of switches M5 and M6 are connected to the node N4, and second terminals of the switches M5 and M6 respectively connected to the nodes N5 and N6. Switches M7 and M8 are respectively connected across the nodes N5 and N6 and the reference potential as shown.

In the amplifier 100, the switches M1 and M2 alternate in buck mode, and the switches M3 and M4 alternate in boost mode. Optionally, all four switches M1 through M4 can also alternate in a buck-boost mode. The switches M5, M6, M7, and M8 adjust the polarity of the output signal (differentially on the nodes N5 and N6). The amplifier 100 is described in further detail in commonly owned U.S. Pat. No. 8,773,196, which is incorporated herein by reference in its entirety.

Typically, a boost converter is followed by separate buck amplifiers. In this configuration, one booster can be used for several amplifiers. While the boost inductor is relatively large, the configuration does allow averaging of amplifier supply currents before requiring power from the battery. That means, for a given peak battery current, one amplifier can have more power if another amplifier is not using much power.

FIG. 2 shows an amplifier architecture 200 comprising multiple buck-boost amplifiers that use a similar peak current protection circuitry, which allows averaging of amplifier supply currents before requiring power from the battery. The amplifier architecture 200 comprises a plurality of amplifiers (e.g., Amp1 100-1, Amp2 100-2, Amp3 100-3, and Amp4 100-4) driving respective loads (not shown). Each of the plurality of amplifiers is similar to the amplifier 100 shown in FIG. 1. Each of the plurality of amplifiers is connected to the battery 102 (shown as $V_{bat}$). While the amplifier architecture 200 is shown as including four amplifiers for example only, it should be understood that the amplifier architecture 200 can include any number (two or more) of amplifiers.

The amplifier architecture 200 further comprises a battery current ($I_{bat}$) measurement and control module (hereinafter controller or control module) 202. The controller 202 sends control signals to the plurality of amplifiers in order for them to adjust their signal levels. In this way, the battery current $I_{bat}$ is controlled. The supply current required by any one of the plurality of amplifiers can be greater than would be allowed if only an average current (divided by N amplifiers) was allowed presuming another amplifier(s) is below the average by at least a commensurate amount. The controller 202 ensures that a total current (average or peak) supplied by the plurality of amplifiers does not exceed a total current that the battery 102 can supply.

In each of the plurality of amplifiers, the inductor current (which is a strong component of the amplifier supply current) includes triangle wave signals added to the average due to the nature of switching amplifiers. The controller 202 can clock the amplifiers at various phases to minimize these triangle waves. However, the amplifiers also need to adjust their duty cycles independently, which prevents total cancellation of the triangle waves.

FIG. 3A shows one way to minimize the triangle waves in the supply current of the amplifiers. Specifically, in FIG. 3A, each of the plurality of amplifiers shown in FIG. 2 is implemented with multiphase. That is, in FIG. 3A, in each of the plurality of amplifiers shown in FIG. 2, the inductor L is split into multiple (e.g., 3) smaller inductors as shown at 106 (hereinafter inductors 106). FIG. 3A can also be used as a single multiphase amplifier which is not connected to other amplifiers.

To achieve this, each of the inductors 106 can have separate transistors shown in FIG. 1. There are many ways to implement this. For example, the switches M5, M6, M7, and M8 need not be separated for each of the inductors 106 since the waveforms from the inductors 106 can be combined at the node N4. Accordingly, in this example, the switches M3 and M4 are duplicated for each of the inductors 106. While the switches M1 and M2 can also be duplicated, the switches M1 and M2 can also not be separate while using a shared node N2. Therefore, only duplicating the switches M3 and M4 for each of the inductors 106 is reasonable since the triangle wave is largest in boost mode with large boost ratios.

FIG. 3B shows an example circuit diagram of multiple buck-boost amplifiers driving a single load. In FIG. 3B, a plurality of buck-boost amplifiers drive a single load 104 as shown. The plurality of buck-boost amplifiers are implemented using well switching devices, which are explained later in the disclosure. Briefly, in FIG. 3B, switches M4a and M4b, which may normally be used with switches M3a and M3b, respectively, are eliminated by using well switched devices M6a, M5a, M6b, and M5b with well switch nodes Sw_m5a, Sw_m6a, Sw_m5b, and Sw_m6b. A controller similar to a controller 202 shown in FIG. 4 controls switches (M1-M3)a, (M1-M3)b, Sw_m5a, Sw_m6a, Sw_m5b, and Sw_m6b.

In a first buck-boost amplifier, a first terminal of the switch M1a is connected to a first terminal of the battery 102 at node N1, and a second terminal of the switch M1a is connected to a node N2a. A first terminal of the switch M2a is connected to the node N2a, and a second terminal of the switch M2a is connected to the reference potential (e.g., ground) to which a second terminal of the battery 102 is connected.

A first terminal of the inductor L1 is connected to the node N2a, and a second terminal of the inductor L1 is connected to a node N3a. A first terminal of the switch M3a is connected to the node N3a, and a second terminal of the switch M3a is connected to the reference potential.

First terminals of the switches M5a and M6a (i.e., well switching devices Sw_m5a and Sw_m6a) are connected to the node N3a. Second terminals of the switches M5a and M6a (i.e., well switching devices Sw_m5a and Sw_m6a) are connected across (i.e., connected respectively to first and second terminals of) the load 104 (i.e., connected respectively to the nodes N5 and N6).

Further, in a second buck-boost amplifier, a first terminal of the switch M1b is connected to the first terminal of the battery 102 at node N1, and a second terminal of the switch M1b is connected to a node N2b. A first terminal of the switch M2b is connected to the node N2b, and a second terminal of the switch M2b is connected to the reference potential (e.g., ground) to which the second terminal of the battery 102 is connected.

A first terminal of the inductor L2 is connected to the node N2b, and a second terminal of the inductor L2 is connected to a node N3b. A first terminal of the switch M3b is connected to the node N3b, and a second terminal of the switch M3b is connected to the reference potential.

First terminals of the switches M5b and M6b (i.e., well switching devices Sw_m5b and Sw_m6b) are connected to the node N3b. Second terminals of the switches M5b and M6b (i.e., well switching devices Sw_m5b and Sw_m6b) are connected across (i.e., connected respectively to the first and second terminals of) the load 104 (i.e., connected respectively to the nodes N5 and N6).

Switches M7 and M8 are respectively connected across the nodes N5 and N6 and the reference potential as shown. Capacitors C1 and C2 are respectively connected across the nodes M5 and N6 and the reference potential as shown.

FIG. 4 shows a way to share additional multiphase inductors between amplifiers. Specifically, each of the plurality of amplifiers shown in FIG. 2 can share one or more additional inductors from an inductor bank 204. The controller 202 further comprises a sharing circuit 206 that includes additional switches to implement the inductor sharing between the plurality of amplifiers (for examples, see FIGS. 5 and 6).

For example, if the Amp1 100-1 is operating at a lower power level, the Amp1 100-1 can use a single inductor (i.e., less inductor current $I_{sat}$ is assigned to it). However, if the Amp2 100-2 requires more power, the Amp2 100-2 can use more inductors from the shared inductor bank 204. If the Amp2 100-2 requires more power, the controller 202 operates the switches of the sharing circuit 206 to connect one or more inductors from the shared inductor bank 204 to the Amp2 100-2 (again, for examples, see FIGS. 5 and 6).

This type of multiphase inductor sharing between the amplifiers and using additional inductors by one amplifier to supply more power when other amplifiers are operating at lower power levels makes sense. This is because there is a total current that can be drawn from the battery 102 that is typically less than a current that would be required when all the amplifiers are used at full power levels. The inductor sharing allows the added triangle waves to be reduced and thereby allows more power per channel without exceeding the allowable battery current. The inductor sharing also allows better utilization of the total saturation current ($I_{sat}$) capabilities of the inductors provided (i.e., the volume of the inductors used is improved while allowing each channel to independently provide the full battery current capability).

Figure 5:
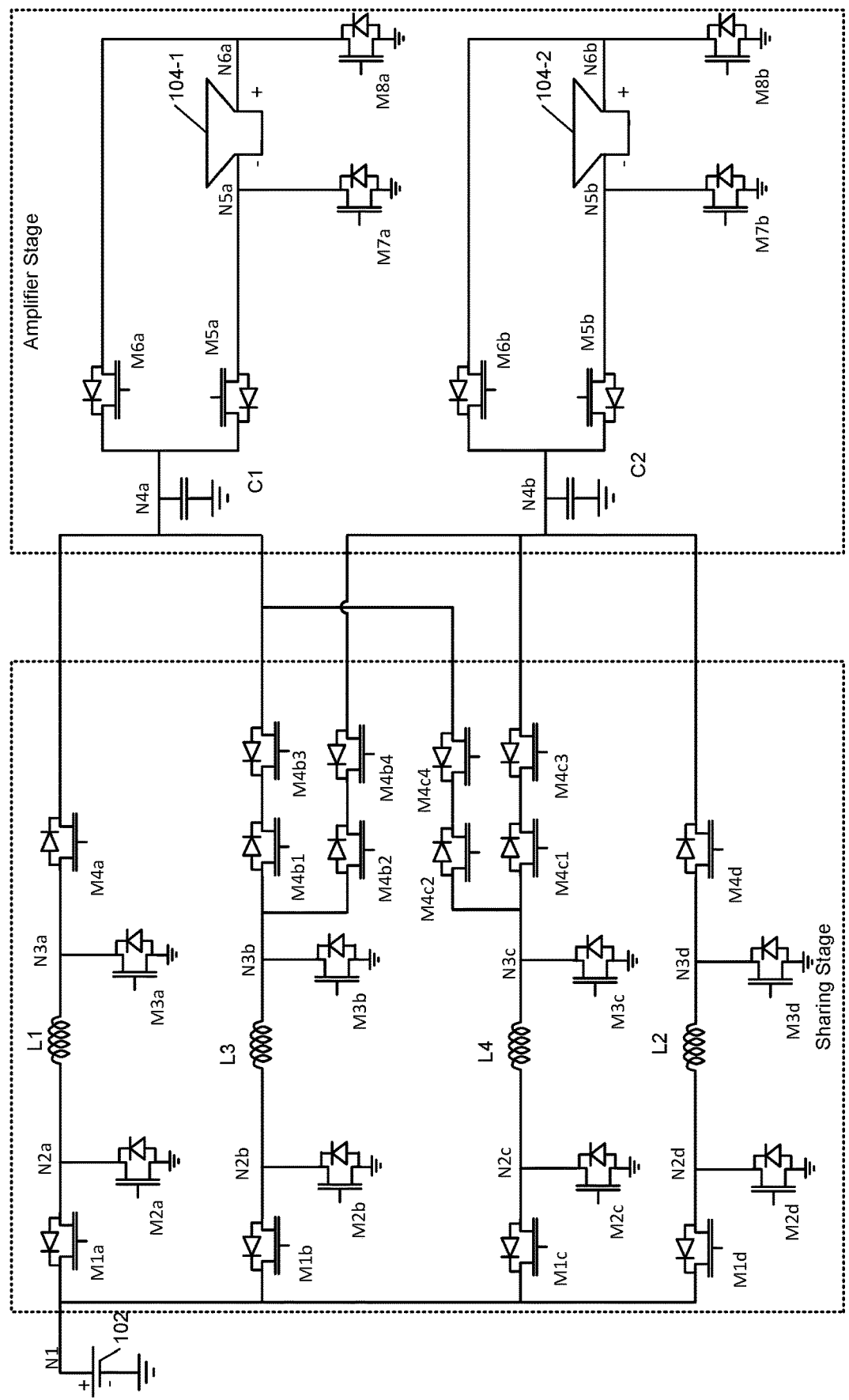
FIG. 5 shows an example circuit diagram of the amplifier architecture of FIG. 4.

FIG. 5 shows one example of sharing multiphase inductors. In this example, two amplifiers are powered with two additional shared inductors. The switches M1, M2, M3, and M4 are either dedicated (i.e., M1a, M2a, M3a, M4a and M1d, M2d, M3d, M4d) or shared (Mxb and Mxc where x is 1-4) as shown. The switches M4bx and M4cx (x=1 to 4) are duplicated as shown to share additional inductors (L3 and L4) with one or more of the two amplifiers.

For further clarification, a first amplifier includes switches (M1-M8)a, inductor L1, capacitor C1, and a first load 104-1; and a second amplifier includes switches (M1-M4)d, switches (M5-M8)b, inductor L2, capacitor C2, and a second load 104-2. The first and second amplifiers are connected to the battery 102 as shown. The first and second amplifiers represent any of the plurality of amplifiers shown in FIG. 4 (e.g., Amp1 100-1, Amp2 100-2, Amp3 100-3, and Amp4 100-4). The first and second amplifiers are similar to the amplifier 100 shown in FIG. 1.

The inductors L3 and L4 are part of the inductor bank 204 shown in FIG. 4. The inductors L3 and L4 are shared between the first and second amplifiers by controlling switches (M1-M3)b, M4b1-M4b4, (M1-M3)c, and M4c1-

M4c4. The switches (M1-M3)b, M4b1-M4b4, (M1-M3)c, and M4c1-M4c4 are part of the sharing circuit 206 shown in FIG. 4. The controller 202 shown in FIG. 4 controls the switches (M1-M3)b, M4b1-M4b4, (M1-M3)c, and M4c1-M4c4 as needed to share one or more of the inductors L3 and L4 with one or more of the first and second amplifiers.

More specifically, the first amplifier includes the switches M1a and M2a connected across the battery 102 as shown. Specifically, a first terminal of the switch M1a is connected to a first terminal of the battery 102 at node N1, and a second terminal of the switch M1a is connected to a node N2a. A first terminal of the switch M2a is connected to the node N2a, and a second terminal of the switch M2a is connected to a reference potential (e.g., ground) to which a second terminal of the battery 102 is connected.

A first terminal of the inductor L1 is connected to the node N2a, and a second terminal of the inductor L1 is connected to a node N3a. A first terminal of the switch M3a is connected to the node N3a, and a second terminal of the switch M3a is connected to the reference potential. A first terminal of the switch M4a is connected to the node N3a, and a second terminal of the switch M4a is connected to a node N4a. A capacitor C1 is connected across the node N4a and the reference potential.

The first load 104-1 in the form of a speaker driven by the first amplifier is connected across nodes N5a and N6a as shown. The switches M5a and M6a respectively connect the nodes N5a and N6a to the node N4a as shown. Specifically, first terminals of the switches M5a and M6a are connected to the node N4a, and second terminals of the switches M5a and M6a respectively connected to the nodes N5a and N6a. The switches M7a and M8a are respectively connected across the nodes N5a and N6a and the reference potential as shown.

In the first amplifier, the switches M1a and M2a alternate in buck mode, and the switches M3a and M4a alternate in boost mode. The switches M5a, M6a, M7a, and M8a adjust the polarity of the output signal (differentially on the nodes N5a and N6a).

The second amplifier includes the switches M1d and M2d connected across the battery 102 as shown. Specifically, a first terminal of the switch M1d is connected to the first terminal of the battery 102 at node N1, and a second terminal of the switch M1d is connected to a node N2d. A first terminal of the switch M2d is connected to the node N2d, and a second terminal of the switch M2d is connected to the reference potential (e.g., ground) to which the second terminal of the battery 102 is connected.

A first terminal of the inductor L2 is connected to the node N2d, and a second terminal of the inductor L2 is connected to a node N3d. A first terminal of the switch M3d is connected to the node N3d, and a second terminal of the switch M3d is connected to the reference potential. A first terminal of the switch M4d is connected to the node N3d, and a second terminal of the switch M4d is connected to a node N4b. A capacitor C2 is connected across the node N4b and the reference potential.

The second load 104-2 in the form of a speaker driven by the second amplifier is connected across nodes N5b and N6b as shown. The switches M5b and M6b respectively connect the nodes N5b and N6b to the node N4b as shown. Specifically, first terminals of the switches M5b and M6b are connected to the node N4b, and second terminals of the switches M5b and M6b are respectively connected to the nodes N5b and N6b. The switches M7b and M8b are respectively connected across the nodes N5b and N6b and the reference potential as shown.

In the second amplifier, the switches M1d and M2d alternate in buck mode, and the switches M3d and M4d alternate in boost mode. The switches M5b, M6b, M7b, and M8b adjust the polarity of the output signal (differentially on the nodes N5b and N6b).

In addition, the inductors L3 and L4 are connected to the first and second amplifiers as follows. A first terminal of the switch M1b is connected to the first terminal of the battery 102 at node N1, and a second terminal of the switch M1b is connected to a node N2b. A first terminal of the switch M2b is connected to the node N2b, and a second terminal of the switch M2b is connected to the reference potential (e.g., ground) to which the second terminal of the battery 102 is connected.

A first terminal of the inductor L3 is connected to the node N2b, and a second terminal of the inductor L3 is connected to a node N3b. A first terminal of the switch M3b is connected to the node N3b, and a second terminal of the switch M3b is connected to the reference potential.

First terminals of the switches M4b1 and M4b2 are connected to the node N3b. Second terminals of the switches M4b1 and M4b2 are respectively connected to first terminals of the switches M4b3 and M4b4. A second terminal of the switch M4b3 is connected to the node N4a. A second terminal of the switch M4b4 is connected to the node N4b.

Further, a first terminal of the switch M1c is connected to the first terminal of the battery 102 at node N1, and a second terminal of the switch M1c is connected to a node N2c. A first terminal of the switch M2c is connected to the node N2c, and a second terminal of the switch M2c is connected to the reference potential (e.g., ground) to which the second terminal of the battery 102 is connected.

A first terminal of the inductor L4 is connected to the node N2c, and a second terminal of the inductor L4 is connected to a node N3c. A first terminal of the switch M3c is connected to the node N3c, and a second terminal of the switch M3c is connected to the reference potential.

First terminals of the switches M4c1 and M4c2 are connected to the node N3c. Second terminals of the switches M4c1 and M4c2 are respectively connected to first terminals of the switches M4c3 and M4c4. A second terminal of the switch M4c3 is connected to the node N4b. A second terminal of the switch M4c4 is connected to the node N4a.

Many variations of the example shown in FIG. 5 are possible without deviating from the teachings of the present disclosure. For example, well switching can be used on the switches M5x and M6x to eliminate the switches M4xx (i.e., switches M4b1-M4b4 and M4c1-M4c4). In the shared example, the switches M5x and M6x are the ones that are duplicated, and the capacitors C1 and C2 can be moved from nodes N4a and N4b to separate capacitors on nodes N5a, N6a, N5b and N6b (e.g., see capacitors C1-C4 in FIGS. 7-10).

Figure 6:
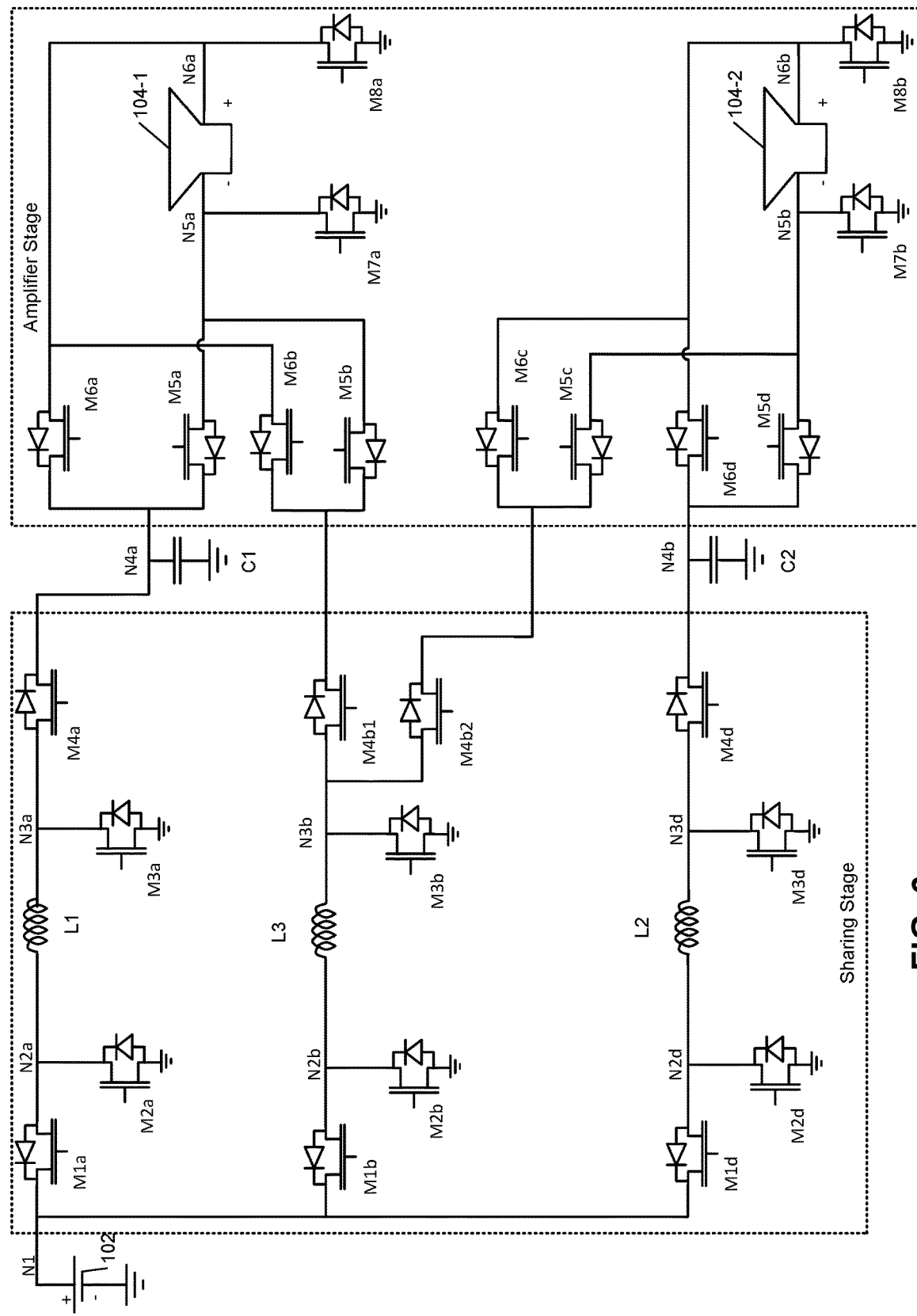
FIG. 6 shows an additional example circuit diagram of the amplifier architecture of FIG. 4.

FIG. 6 shows another example of sharing multiphase inductors. In this example, two amplifiers are powered with one additional shared inductor. The shared inductor can alternate pulses between outputs as needed. This is similar to a SIMO converter using a shared output to serve more than one output.

For example, a first amplifier includes switches (M1-M8)a, inductor L1, capacitor C1, and a first load 104-1; and a second amplifier includes switches (M1-M6)d, switches M7b and M8b, inductor L2, capacitor C2, and a second load 104-2. The first and second amplifiers are connected to the battery 102 as shown. The first and second amplifiers represent any of the plurality of amplifiers shown in FIG. 4 (e.g., Amp1 100-1, Amp2 100-2, Amp3 100-3, and Amp4

100-4). The first and second amplifiers are similar to the amplifier 100 shown in FIG. 1.

The inductor L3 is part of the inductor bank 204 shown in FIG. 4. The inductor L3 is shared between the first and second amplifiers by controlling switches (M1-M3)b, M4b1, M4b2, M5b, M6b, M5c, and M6c. The switches (M1-M3)b, M4b1, M4b2, M5b, M6b, M5c, and M6c are part of the sharing circuit 206 shown in FIG. 4. The controller 202 shown in FIG. 4 controls the switches (M1-M3)b, M4b1, M4b2, M5b, M6b, M5c, and M6c as needed to share the inductor L3 with one or more of the first and second amplifiers. The inductor L3 can be controlled in continuous conduction mode (CCM) or discontinuous conduction mode (DCM).

An additional configuration of the connection between the shared inductor L3 and the two outputs (i.e., M4b1, M4b2, M5b, M6b, M5c, and M6c) is used in this example to illustrate that there are many ways to implement the transistors to share the inductor(s) with the amplifiers. Further, as noted above, well switching (i.e., body diode switching) devices can be used to reduce the number of transistors or change the transistor structure. While well switching (i.e., body diode switching) results in transistors with higher on resistance, fewer switches can be used. Also, C1 and C2 can be replaced with capacitors on nodes N5x and N6x in different configurations as mentioned above (i.e., the capacitors C1 and C2 can be moved from nodes N4a and N4b to separate capacitors on nodes N5a, N6a, N5b and N6b (e.g., see capacitors C1-C4 in FIGS. 7-10)).

In FIG. 6, there are two types of sharing stages: a first type of sharing stage includes duplicated transistors M4 to allow driving two or more loads, and a second type of sharing stage includes a transistor M4 dedicated to a specific load. For example, the first type of sharing stage includes the inductor L3 and the switches (M1-M3)b, M4b1, and M4b2, where the duplicated switches M4b1 and M4b2 respectively drive the first and second loads 104-1 and 104-2 via switches M5b, M6b, M5c and M6c. A first one of the second type of sharing stage includes the inductor L1 and the switches (M1-M4)a, where the switch M4a is dedicated to drive the first load 104-1. A second one of the second type of sharing stage includes the inductor L2 and the switches (M1-M4)d, where the switch M4d is dedicated to drive the second load 104-2.

More specifically, the first amplifier includes the switches M1a and M2a connected across the battery 102 as shown. Specifically, a first terminal of the switch M1a is connected to a first terminal of the battery 102 at node N1, and a second terminal of the switch M1a is connected to a node N2a. A first terminal of the switch M2a is connected to the node N2a, and a second terminal of the switch M2a is connected to a reference potential (e.g., ground) to which a second terminal of the battery 102 is connected.

A first terminal of the inductor L1 is connected to the node N2a, and a second terminal of the inductor L1 is connected to a node N3a. A first terminal of the switch M3a is connected to the node N3a, and a second terminal of the switch M3a is connected to the reference potential. A first terminal of the switch M4a is connected to the node N3a, and a second terminal of the switch M4a is connected to a node N4a. A capacitor C1 is connected across the node N4a and the reference potential.

The first load 104-1 in the form of a speaker driven by the first amplifier is connected across nodes N5a and N6a as shown. The switches M5a and M6a respectively connect the nodes N5a and N6a to the node N4a as shown. Specifically, first terminals of the switches M5a and M6a are connected to the node N4a, and second terminals of the switches M5a and M6a respectively connected to the nodes N5a and N6a. The switches M7a and M8a are respectively connected across the nodes N5a and N6a and the reference potential as shown.

In the first amplifier, the switches M1a and M2a alternate in buck mode, and the switches M3a and M4a alternate in boost mode. The switches M5a, M6a, M7a, and M8a adjust the polarity of the output signal (differentially on the nodes N5a and N6a).

The second amplifier includes the switches M1d and M2d connected across the battery 102 as shown. Specifically, a first terminal of the switch M1d is connected to the first terminal of the battery 102 at node N1, and a second terminal of the switch M1d is connected to a node N2d. A first terminal of the switch M2d is connected to the node N2d, and a second terminal of the switch M2d is connected to the reference potential (e.g., ground) to which the second terminal of the battery 102 is connected.

A first terminal of the inductor L2 is connected to the node N2d, and a second terminal of the inductor L2 is connected to a node N3d. A first terminal of the switch M3d is connected to the node N3d, and a second terminal of the switch M3d is connected to the reference potential. A first terminal of the switch M4d is connected to the node N3d, and a second terminal of the switch M4d is connected to a node N4b. A capacitor C2 is connected across the node N4b and the reference potential.

The second load 104-2 in the form of a speaker driven by the second amplifier is connected across nodes N5b and N6b as shown. The switches M5d and M6d respectively connect the nodes N5b and N6b to the node N4b as shown. Specifically, first terminals of the switches M5d and M6d are connected to the node N4b, and second terminals of the switches M5d and M6d are respectively connected to the nodes N5b and N6b. The switches M7b and M8b are respectively connected across the nodes N5b and N6b and the reference potential as shown.

In the second amplifier, the switches M1d and M2d alternate in buck mode, and the switches M3d and M4d alternate in boost mode. The switches M5d, M6d, M7b, and M8b adjust the polarity of the output signal (differentially on the nodes N5b and N6b).

In addition, the inductor L3 is connected to the first and second amplifiers and to the first and second loads 104-1 and 104-2 as follows. A first terminal of the switch M1b is connected to the first terminal of the battery 102 at node N1, and a second terminal of the switch M1b is connected to a node N2b. A first terminal of the switch M2b is connected to the node N2b, and a second terminal of the switch M2b is connected to the reference potential (e.g., ground) to which the second terminal of the battery 102 is connected.

A first terminal of the inductor L3 is connected to the node N2b, and a second terminal of the inductor L3 is connected to a node N3b. A first terminal of the switch M3b is connected to the node N3b, and a second terminal of the switch M3b is connected to the reference potential.

First terminals of the switches M4b1 and M4b2 are connected to the node N3b. A second terminal of the switch M4b1 is connected to first terminals of the switches M5b and M6b. Second terminals of the switches M5b and M6b are respectively connected to the second terminals of the switches M5a and M6a (i.e., to the nodes N5a and N6a). A second terminal of the switch M4b2 is connected to first terminals of the switches M5c and M6c. Second terminals of the switches M5c and M6c are respectively connected to the second terminals of the switches M5d and M6d (i.e., to the nodes N5b and N6b).

In an additional embodiment, all of the stages can be connected to both the loads (e.g., by also duplicating the switches M4a and M4d similar to the duplicated switches M4b1 and M4b2) and can be operated in a single inductor multiple output (SIMO) mode. This can be done with as few as one shared stage (one inductor). There can also be two or more loads. There can also be more than one shared stage per amplifier stage although care should be taken regarding body diodes turning on or well-switching can be used.

Figure 7:
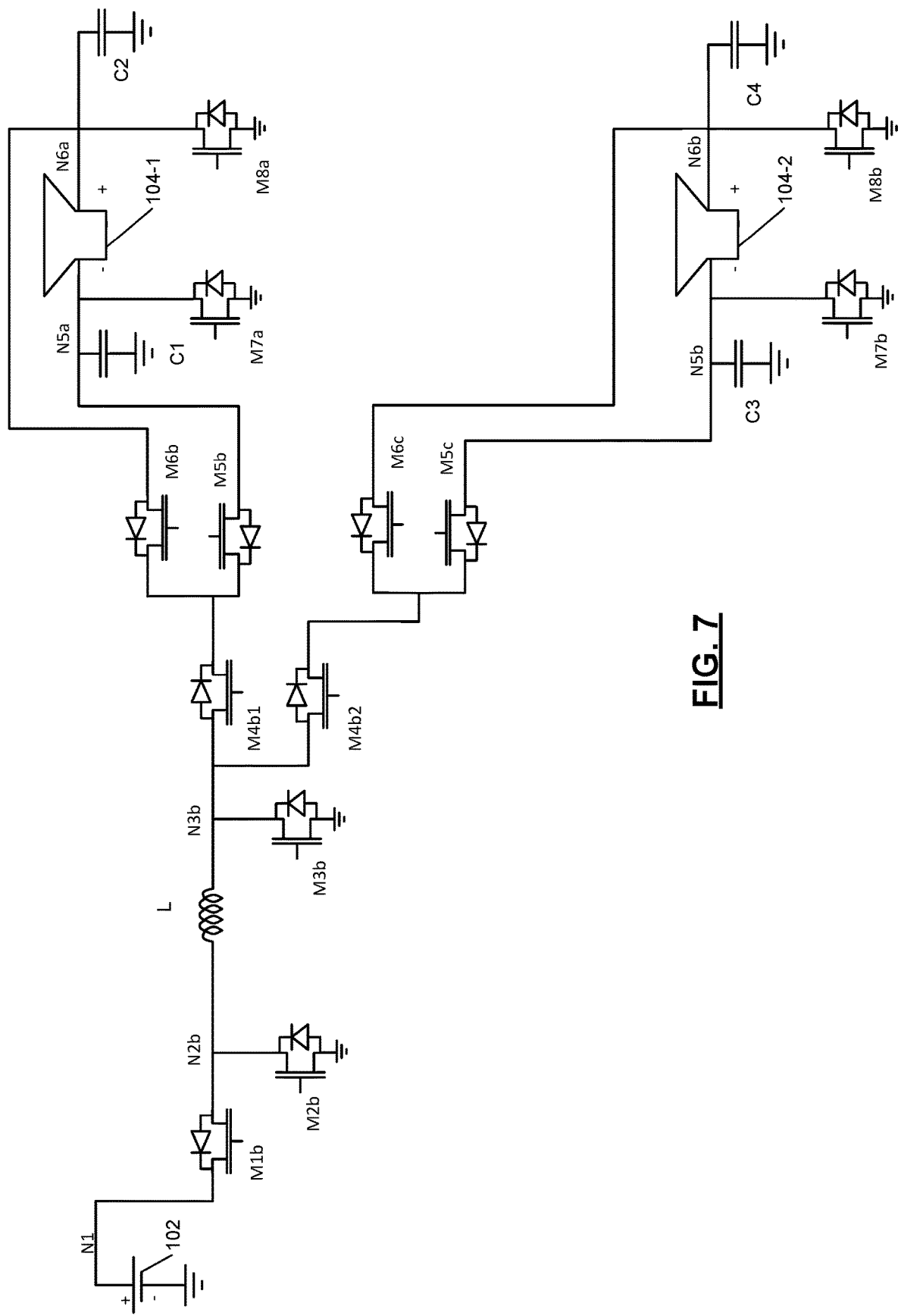
FIG. 7 shows an example circuit diagram of a single inductor multiple output (SIMO) amplifier.

FIG. 7 shows an example of an amplifier operated in the SIMO mode. A controller similar to the controller 202 shown in FIG. 4 controls switches (M1-M3)b, M4b1, M4b2, M5b, M6b, M5c, and M6c to operate the amplifier in the SIMO mode. More control information for M1-M4 is provided in the jointly filed application titled "Continuous Conduction Mode SIMO Device" (62/798,129), which is incorporated herein by reference in its entirety. The amplifier of FIG. 7 is not a resonant SIMO amplifier or a resonant SIMO converter, and does not include a capacitor (called a resonant capacitor) connected to inductor L, where the capacitor and the inductor form a resonator or a resonant circuit.

More specifically, a first terminal of the switch M1b is connected to a first terminal of the battery 102 at node N1, and a second terminal of the switch M1b is connected to a node N2b. A first terminal of the switch M2b is connected to the node N2b, and a second terminal of the switch M2b is connected to the reference potential (e.g., ground) to which a second terminal of the battery 102 is connected.

A first terminal of the inductor L is connected to the node N2b, and a second terminal of the inductor L is connected to a node N3b. A first terminal of the switch M3b is connected to the node N3b, and a second terminal of the switch M3b is connected to the reference potential. There is no capacitor (called a resonant capacitor) directly connected to the inductor L, where the capacitor and the inductor L form a resonator or a resonant circuit.

First terminals of the switches M4b1 and M4b2 are connected to the node N3b. A second terminal of the switch M4b1 is connected to first terminals of the switches M5b and M6b. Second terminals of the switches M5b and M6b are connected across (i.e., connected respectively to first and second terminals of) the first load 104-1 (i.e., connected respectively to the nodes N5a and N6a). The switches M7a and M8a are respectively connected across the nodes N5a and N6a and the reference potential as shown. Capacitors C1 and C2 are respectively connected across the nodes M5a and N6a and the reference potential as shown.

A second terminal of the switch M4b2 is connected to first terminals of the switches M5c and M6c. Second terminals of the switches M5c and M6c are connected across (i.e., connected respectively to first and second terminals of) the second load 104-2 (i.e., connected respectively to the nodes N5b and N6b). The switches M7b and M8b are respectively connected across the nodes N5b and N6b and the reference potential as shown. Capacitors C3 and C4 are respectively connected across the nodes M5a and N6a and the reference potential as shown.

Figure 8:
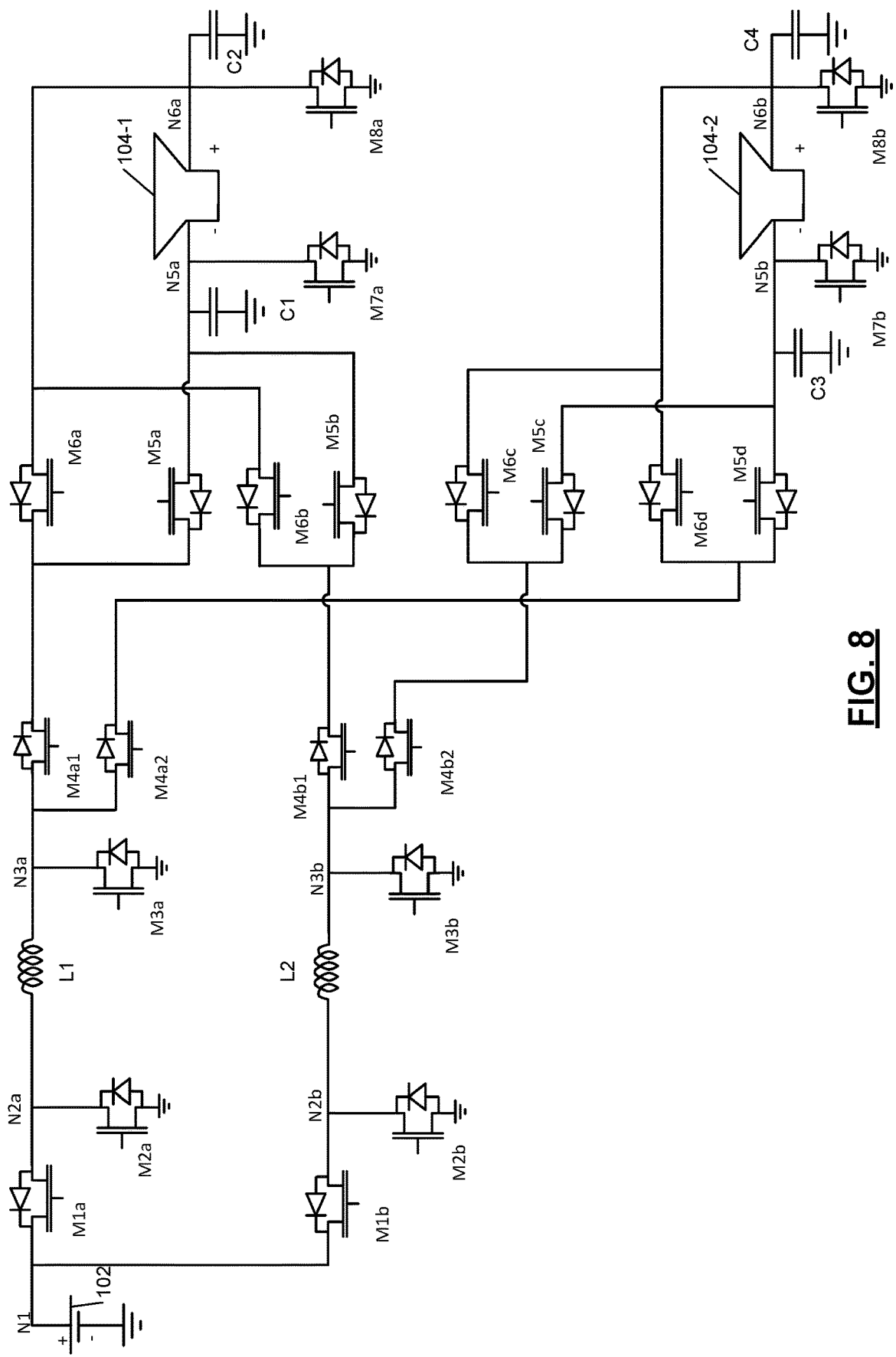
FIG. 8 shows an example circuit diagram of a two-phase SIMO amplifier.

FIG. 8 shows an example of a two-phase amplifier configured in the SIMO mode. The SIMO nomenclature is used instead of using Dual/Multiple Inductor Multiple Output, which would make the amplifier a DIMO or MIMO amplifier. A controller similar to the controller 202 shown in FIG. 4 controls switches (M1-M3)a, M4a1, M4a2, M5a, M6a, M5b, M6b, (M1-M3)b, M4b1, M4b2, M5c, M6c, M5d, and M6d to operate the amplifier in the SIMO mode. The configuration shown in FIG. 8 essentially includes two amplifiers shown in FIG. 7 and can be useful in applications where a Z-height of the inductors or peak battery current is a concern. The amplifier of FIG. 8 is not a resonant SIMO amplifier or a resonant SIMO converter, and does not include a capacitor (called a resonant capacitor) connected to inductor L1 or L2, where the capacitor and the inductor form a resonator or a resonant circuit.

More specifically, a first terminal of the switch M1a is connected to a first terminal of the battery 102 at node N1, and a second terminal of the switch M1a is connected to a node N2a. A first terminal of the switch M2a is connected to the node N2a, and a second terminal of the switch M2a is connected to the reference potential (e.g., ground) to which a second terminal of the battery 102 is connected.

A first terminal of the inductor L1 is connected to the node N2a, and a second terminal of the inductor L1 is connected to a node N3a. A first terminal of the switch M3a is connected to the node N3a, and a second terminal of the switch M3a is connected to the reference potential. There is no capacitor (called a resonant capacitor) directly connected to the inductor L1, where the capacitor and the inductor L1 form a resonator or a resonant circuit.

First terminals of the switches M4a1 and M4a2 are connected to the node N3a. A second terminal of the switch M4a1 is connected to first terminals of the switches M5a and M6a. Second terminals of the switches M5a and M6a are connected across (i.e., connected respectively to first and second terminals of) the first load 104-1 (i.e., connected respectively to the nodes N5a and N6a). The switches M7a and M8a are respectively connected across the nodes N5a and N6a and the reference potential as shown. Capacitors C1 and C2 are respectively connected across the nodes M5a and N6a and the reference potential as shown.

A second terminal of the switch M4a2 is connected to first terminals of the switches M5d and M6d. Second terminals of the switches M5d and M6d are connected across (i.e., connected respectively to first and second terminals of) the second load 104-2 (i.e., connected respectively to the nodes N5b and N6b). The switches M7b and M8b are respectively connected across the nodes N5b and N6b and the reference potential as shown. Capacitors C3 and C4 are respectively connected across the nodes N5b and N6b and the reference potential as shown.

Further, a first terminal of the switch M1b is connected to the first terminal of the battery 102 at node N1, and a second terminal of the switch M1b is connected to a node N2b. A first terminal of the switch M2b is connected to the node N2b, and a second terminal of the switch M2b is connected to the reference potential (e.g., ground) to which the second terminal of the battery 102 is connected.

A first terminal of the inductor L2 is connected to the node N2b, and a second terminal of the inductor L2 is connected to a node N3b. A first terminal of the switch M3b is connected to the node N3b, and a second terminal of the switch M3b is connected to the reference potential. There is no capacitor (called a resonant capacitor) directly connected to the inductor L2, where the capacitor and the inductor L2 form a resonator or a resonant circuit.

First terminals of the switches M4b1 and M4b2 are connected to the node N3b. A second terminal of the switch M4b1 is connected to first terminals of the switches M5b and M6b. Second terminals of the switches M5b and M6b are connected across (i.e., connected respectively to the first and second terminals of) the first load 104-1 (i.e., connected respectively to the nodes N5a and N6a).

A second terminal of the switch M4b2 is connected to first terminals of the switches M5c and M6c. Second terminals of the switches M5c and M6c are connected across (i.e., connected respectively to the first and second terminals of) the second load 104-2 (i.e., connected respectively to the nodes N5b and N6b).

Figure 9:
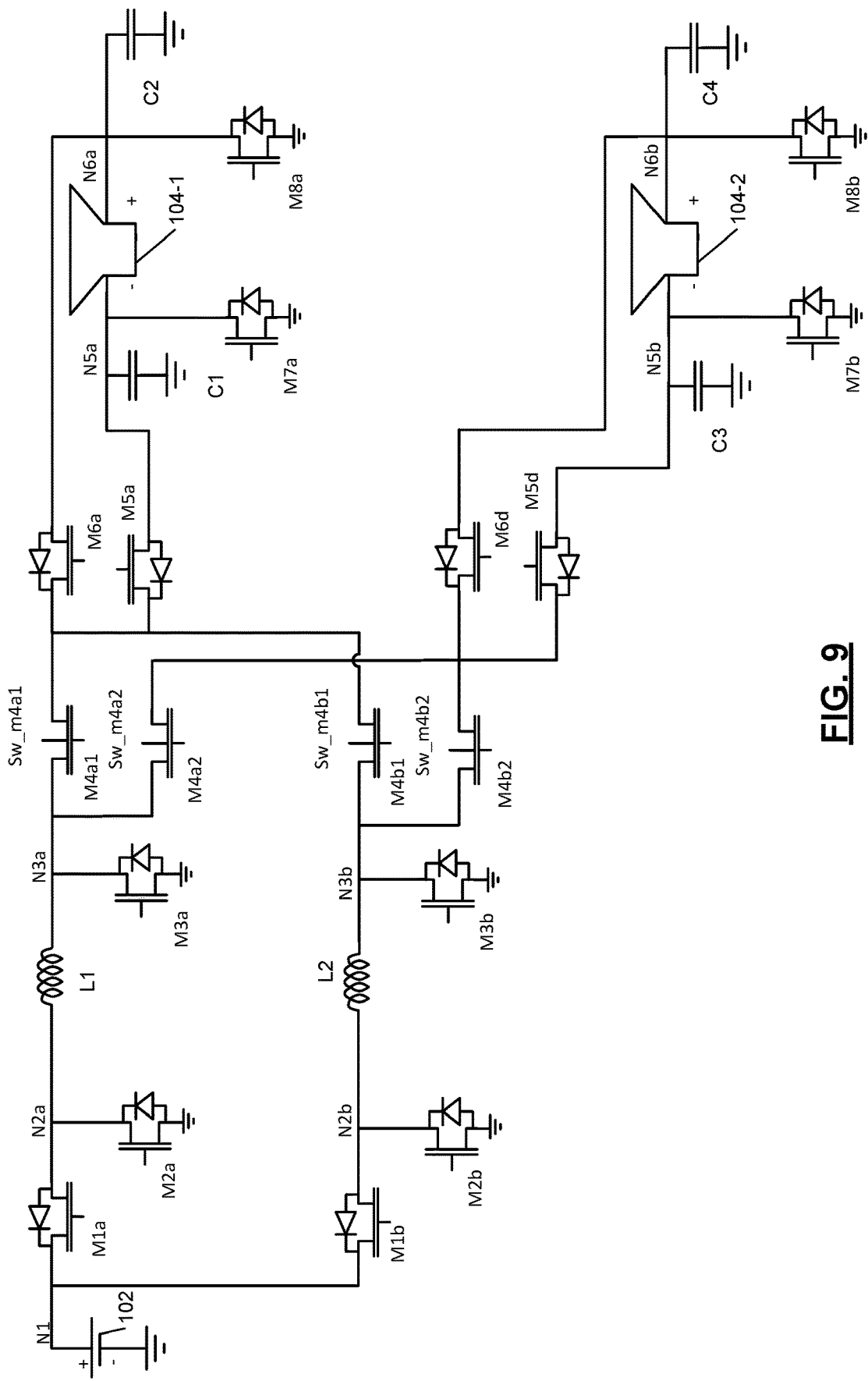
FIG. 9 shows an example circuit diagram of a two-phase SIMO amplifier with well switching.

FIG. 9 shows a first example of the two-phase amplifier of FIG. 8 implemented using well switching devices. Specifically, the switches M4a1, M4a2, M4b1, and M4b2 of FIG. 8 are replaced in FIG. 9 with well switching devices Sw_m4a1, Sw_m4a2, Sw_m4b1, and Sw_m4b2 to eliminate switches M5b, M6b, M5c, and M6c. A controller similar to the controller 202 shown in FIG. 4 controls switches (M1-M3)a, Sw_m4a1, Sw_m4a2, M5a, M6a, (M1-M3)b, Sw_m4b1, Sw_m4b2, M5d, and M6d to operate the amplifier in the SIMO mode. The amplifier of FIG. 9 is not a resonant SIMO amplifier or a resonant SIMO converter, and does not include a capacitor (called a resonant capacitor) connected to inductor L1 or L2, where the capacitor and the inductor form a resonator or a resonant circuit.

More specifically, a first terminal of the switch M1a is connected to a first terminal of the battery 102 at node N1, and a second terminal of the switch M1a is connected to a node N2a. A first terminal of the switch M2a is connected to the node N2a, and a second terminal of the switch M2a is connected to the reference potential (e.g., ground) to which a second terminal of the battery 102 is connected.

A first terminal of the inductor L1 is connected to the node N2a, and a second terminal of the inductor L1 is connected to a node N3a. A first terminal of the switch M3a is connected to the node N3a, and a second terminal of the switch M3a is connected to the reference potential. There is no capacitor (called a resonant capacitor) directly connected to the inductor L1, where the capacitor and the inductor L1 form a resonator or a resonant circuit.

First terminals of the switches M4a1 and M4a2 (i.e., well switching devices Sw_m4a1 and Sw_m4a2) are connected to the node N3a. A second terminal of the switch M4a1 (i.e., well switching device Sw_m4a1) is connected to first terminals of the switches M5a and M6a. Second terminals of the switches M5a and M6a are connected across (i.e., connected respectively to first and second terminals of) the first load 104-1 (i.e., connected respectively to the nodes N5a and N6a). The switches M7a and M8a are respectively connected across the nodes N5a and N6a and the reference potential as shown. Capacitors C1 and C2 are respectively connected across the nodes N5a and N6a and the reference potential as shown.

A second terminal of the switch M4a2 (i.e., well switching device Sw_m4a2) is connected to first terminals of the switches M5d and M6d. Second terminals of the switches M5d and M6d are connected across (i.e., connected respectively to first and second terminals of) the second load 104-2 (i.e., connected respectively to the nodes N5b and N6b). The switches M7b and M8b are respectively connected across the nodes N5b and N6b and the reference potential as shown. Capacitors C3 and C4 are respectively connected across the nodes N5b and N6b and the reference potential as shown.

Further, a first terminal of the switch M1b is connected to the first terminal of the battery 102 at node N1, and a second terminal of the switch M1b is connected to a node N2b. A first terminal of the switch M2b is connected to the node N2b, and a second terminal of the switch M2b is connected to the reference potential (e.g., ground) to which the second terminal of the battery 102 is connected.

A first terminal of the inductor L2 is connected to the node N2b, and a second terminal of the inductor L2 is connected to a node N3b. A first terminal of the switch M3b is connected to the node N3b, and a second terminal of the switch M3b is connected to the reference potential. There is no capacitor (called a resonant capacitor) directly connected to the inductor L2, where the capacitor and the inductor L2 form a resonator or a resonant circuit.

First terminals of the switches M4b1 and M4b2 (i.e., well switching devices Sw_m4b1 and Sw_m4b2) are connected to the node N3b. A second terminal of the switch M4b1 (i.e., well switching device Sw_m4b1) is connected to the first terminals of the switches M5b and M6b. A second terminal of the switch M4b2 (i.e., well switching device Sw_m4b2) is connected to the first terminals of the switches M5d and M6d.

Figure 10:
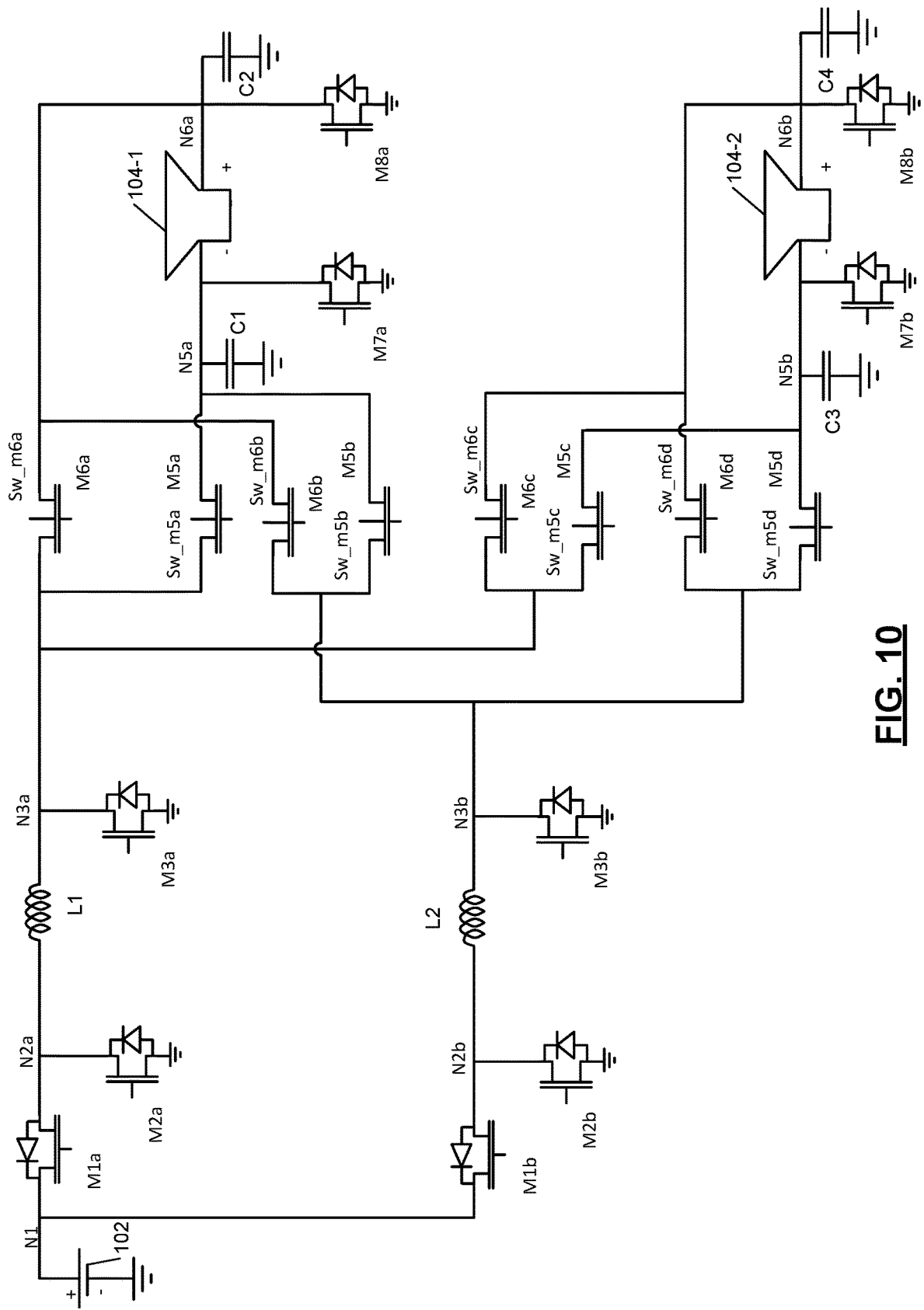
FIG. 10 shows an additional example circuit diagram of a two-phase SIMO amplifier with well switching.
Figure 11:
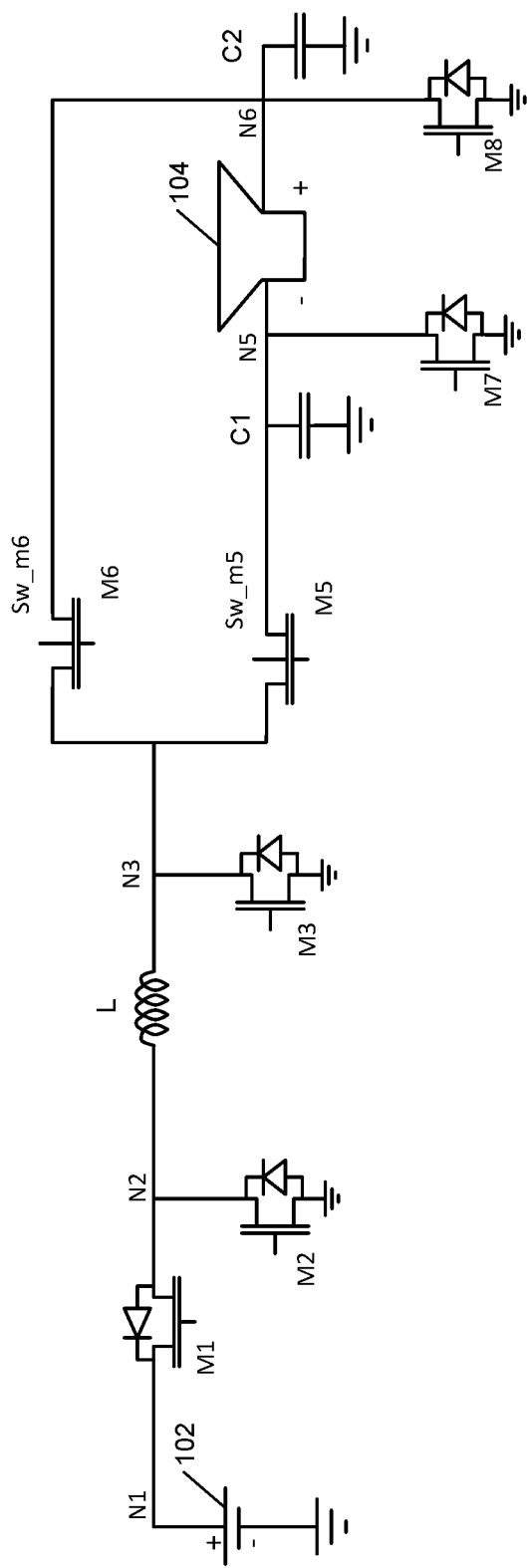
FIG. 11 shows an additional example of a buck-boost amplifier that uses well switching devices.

FIG. 10 shows a first example of the two-phase amplifier of FIG. 8 implemented using well switching devices. Specifically, in FIG. 10, the switches M4a1, M4a2, M4b1, and M4b2 of FIG. 8 are eliminated by replacing the switches M5a, M6a, M5b, M6b, M5c, M6c, M5d, and M6d of FIG. 8 with well switched devices M6a, M5a, M6b, M5b, M6c, M5c, M6d, and M5d with well switch nodes Sw_m5a, Sw_m6a, Sw_m5b, Sw_m6b, Sw_m5c, Sw_m6c, Sw_m5d, and Sw_m6d. A controller similar to the controller 202 shown in FIG. 4 controls switches (M1-M3)a, (M1-M3)b, Sw_m5a, Sw_m6a, Sw_m5b, Sw_m6b, Sw_m5c, Sw_m6c, Sw_m5d, and Sw_m6d to operate the amplifier in the SIMO mode. The amplifier of FIG. 10 is not a resonant SIMO amplifier or a resonant SIMO converter, and does not include a capacitor (called a resonant capacitor) connected to inductor L1 or L2, where the capacitor and the inductor form a resonator or a resonant circuit.

More specifically, a first terminal of the switch M1a is connected to a first terminal of the battery 102 at node N1, and a second terminal of the switch M1a is connected to a node N2a. A first terminal of the switch M2a is connected to the node N2a, and a second terminal of the switch M2a is connected to the reference potential (e.g., ground) to which a second terminal of the battery 102 is connected.

A first terminal of the inductor L1 is connected to the node N2a, and a second terminal of the inductor L1 is connected to a node N3a. A first terminal of the switch M3a is connected to the node N3a, and a second terminal of the switch M3a is connected to the reference potential. There is no capacitor (called a resonant capacitor) directly connected to the inductor L1, where the capacitor and the inductor L1 form a resonator or a resonant circuit.

First terminals of the switches M5a and M6a (i.e., well switching devices Sw_m5a and Sw_m6a) are connected to the node N3a. Second terminals of the switches M5a and M6a (i.e., well switching devices Sw_m5a and Sw_m6a) are connected across (i.e., connected respectively to first and second terminals of) the first load 104-1 (i.e., connected respectively to the nodes N5a and N6a). The switches M7a and M8a are respectively connected across the nodes N5a and N6a and the reference potential as shown. Capacitors C1 and C2 are respectively connected across the nodes M5a and N6a and the reference potential as shown.

Further, a first terminal of the switch M1b is connected to the first terminal of the battery 102 at node N1, and a second terminal of the switch M1b is connected to a node N2b. A first terminal of the switch M2b is connected to the node N2b, and a second terminal of the switch M2b is connected to the reference potential (e.g., ground) to which the second terminal of the battery 102 is connected.

A first terminal of the inductor L2 is connected to the node N2b, and a second terminal of the inductor L2 is connected to a node N3b. A first terminal of the switch M3b is connected to the node N3b, and a second terminal of the switch M3b is connected to the reference potential. There is no capacitor (called a resonant capacitor) directly connected to the inductor L2, where the capacitor and the inductor L2 form a resonator or a resonant circuit.

First terminals of the switches M5d and M6d (i.e., well switching devices Sw_m5d and Sw_m6d) are connected to the node N3b. Second terminals of the switches M5d and M6d (i.e., well switching devices Sw_m5d and Sw_m6d) are connected across (i.e., connected respectively to first and second terminals of) the second load 104-2 (i.e., connected respectively to the nodes N5b and N6b). The switches M7b and M8b are respectively connected across the nodes N5b and N6b and the reference potential as shown. Capacitors C3 and C4 are respectively connected across the nodes M5b and N6b and the reference potential as shown.

In addition, first terminals of the switches M5c and M6c (i.e., well switching devices Sw_m5c and Sw_m6c) are connected to the node N3a. Second terminals of the switches M5c and M6c (i.e., well switching devices Sw_m5c and Sw_m6c) are connected across (i.e., connected respectively to the first and second terminals of) the second load 104-2 (i.e., connected respectively to the nodes N5b and N6b).

Further, first terminals of the switches M5b and M6b (i.e., well switching devices Sw_m5b and Sw_m6b) are connected to the node N3b. Second terminals of the switches M5b and M6b (i.e., well switching devices Sw_m5b and Sw_m6b) are connected across (i.e., connected respectively to the first and second terminals of) the first load 104-1 (i.e., connected respectively to the nodes N5a and N6a).

In all the examples shown and described throughout the present disclosure, at least one capacitor can be used per amplifier stage that can be connected between shared stage(s) and amplifier stage(s) (e.g., at nodes N4x). This capacitor can also be duplicated and connected to nodes N5a, N5b, etc., and to nodes N6a, N6b, etc.

FIG. 11 shows an additional example of a buck-boost amplifier that drive the load 104 and that uses well switching devices Sw_m5 and Sw_m6 and capacitors connected to nodes N5 and N6. A switch M4 that may normally be used with switch M3 is eliminated by using well switched devices M5 and M6 with well switch nodes Sw_m5 and Sw_m6. A controller similar to a controller 202 shown in FIG. 4 controls the switches M1-M3, Sw_m5, Sw_m6, Sw_m5b, Sw_m6b, M7, and M8.

Switches M1 and M2 are connected across a battery 102 as shown. Specifically, a first terminal of the switch M1 is connected to a first terminal of the battery 102 at node N1, and a second terminal of the switch M1 is connected to a node N2. A first terminal of the switch M2 is connected to the node N2, and a second terminal of the switch M2 is connected to a reference potential (e.g., ground) to which a second terminal of the battery 102 is connected.

A first terminal of an inductor L is connected to the node N2, and a second terminal of the inductor L is connected to a node N3. A first terminal of a switch M3 is connected to the node N3, and a second terminal of the switch M3 is connected to the reference potential.

A load 104 in the form of a speaker driven by the amplifier is connected across nodes N5 and N6 as shown. First terminals of the switches M5 and M6 are connected to the node N3. Second terminals of the switches M5 and M6 are connected across (i.e., connected respectively to first and second terminals of) the load 104 (i.e., connected respectively to the nodes N5 and N6). The switches M7 and M8 are respectively connected across the nodes N5 and N6 and the reference potential as shown. Capacitors C1 and C2 are respectively connected across the nodes M5a and N6a and the reference potential as shown.

The amplifiers disclosed in the present disclosure can be used in many applications. For example only, the amplifiers can be used as audio amplifiers. Other uses where the teachings of the present disclosure can be useful are contemplated.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave). The term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), and volatile memory circuits (such as a static random access memory circuit or a dynamic random access memory circuit).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

None of the elements recited in the claims are intended to be a means-plus-function element within the meaning of 35 U.S.C. § 112(f) unless an element is expressly recited using the phrase "means for," or in the case of a method claim using the phrases "operation for" or "step for."

What is claimed is:

1. A system comprising:
    a first buck-boost amplifier that is connected to a battery, that includes a first inductor, and that drives a first load;
    a second buck-boost amplifier that is connected to the battery, that includes a second inductor, and that drives a second load;
    a third inductor;
    a plurality of switches connected to the third inductor; and
    a controller that drives the plurality of switches to connect the third inductor to the first buck-boost amplifier or the second buck-boost amplifier.

2. The system of claim 1 wherein the controller drives the plurality of switches to connect the third inductor to the first buck-boost amplifier or the second buck-boost amplifier based on an amount of power used by the first and second buck-boost amplifiers to respectively drive the first and second loads.

3. The system of claim 1 wherein the first and second buck-boost amplifiers additionally drive the second and first loads, respectively.

4. The system of claim 1 wherein the first and second loads include speakers, piezo elements, or motors.

5. The system of claim 1 wherein the plurality of switches includes well switching devices.

6. The system of claim 1 further comprising:
    a fourth inductor; and
    a second plurality of switches connected to the fourth inductor,
    wherein the controller drives the second plurality of switches to connect the fourth inductor to the first buck-boost amplifier or the second buck-boost amplifier.

7. The system of claim 6 wherein the controller drives the second plurality of switches to connect the fourth inductor to the first buck-boost amplifier or the second buck-boost amplifier based on an amount of power used by the first and second buck-boost amplifiers to respectively drive the first and second loads.

8. The system of claim 6 wherein the plurality of switches and the second plurality of switches include well switching devices.

* * * * *